(12) United States Patent
Hakuma et al.

(10) Patent No.: US 8,575,478 B2
(45) Date of Patent: Nov. 5, 2013

(54) INTEGRATED STRUCTURE OF CIS BASED SOLAR CELL

(75) Inventors: Hideki Hakuma, Tokyo (JP); Yoshiaki Tanaka, Tokyo (JP); Tetsuya Aramoto, Tokyo (JP); Katsumi Kushiya, Tokyo (JP)

(73) Assignee: Showa Shell Sekiyu K.K., Tokyo (JP)

( * ) Notice: Subject to any disclaimer, the term of this patent is extended or adjusted under 35 U.S.C. 154(b) by 373 days.

(21) Appl. No.: 12/921,222

(22) PCT Filed: Mar. 7, 2008

(86) PCT No.: PCT/JP2008/054157
§ 371 (c)(1),
(2), (4) Date: Sep. 7, 2010

(87) PCT Pub. No.: WO2009/110093
PCT Pub. Date: Sep. 11, 2009

(65) Prior Publication Data
US 2011/0011451 A1  Jan. 20, 2011

(51) Int. Cl.
*H01L 31/00* (2006.01)
*H01L 21/00* (2006.01)

(52) U.S. Cl.
USPC ........... 136/265; 136/260; 136/249; 136/255; 438/95; 438/85

(58) Field of Classification Search
USPC ............... 136/255, 265, 260, 249; 438/85, 95
See application file for complete search history.

(56) References Cited

U.S. PATENT DOCUMENTS

| | | | | |
|---|---|---|---|---|
| 4,335,266 A | * | 6/1982 | Mickelsen et al. | 136/260 |
| 4,611,091 A | | 9/1986 | Choudary et al. | |
| 5,416,337 A | * | 5/1995 | Chang et al. | 257/13 |
| 6,040,521 A | * | 3/2000 | Kushiya et al. | 136/265 |
| 6,259,016 B1 | | 7/2001 | Negami et al. | |
| 2005/0253142 A1 | | 11/2005 | Negami et al. | |
| 2006/0180200 A1 | * | 8/2006 | Bjorkman et al. | 136/265 |
| 2009/0065060 A1 | | 3/2009 | Yonezawa et al. | |

FOREIGN PATENT DOCUMENTS

| | | |
|---|---|---|
| EP | 1710844 A1 | 10/2006 |
| JP | 04-094174 A | 3/1992 |
| JP | 0838863 * | 4/1997 |
| JP | 2000-323733 A | 11/2000 |

(Continued)

OTHER PUBLICATIONS

JP2002-373995, Machine Translation, Ueda, Dec. 2202.*

(Continued)

*Primary Examiner* — Devina Pillay
(74) *Attorney, Agent, or Firm* — Cermak Nakajima LLP; Tomoko Nakajima (57) ABSTRACT

In an integrated structure of a CIS based thin film solar cell obtained by stacking an light absorbing layer, a high-resistance buffer layer, and a window layer in that order, a first buffer layer adjoining the light absorbing layer is made of a compound containing cadmium (Cd), zinc (Zn), or indium (In), a second buffer layer adjoining the first buffer layer is made of a zinc oxide-based thin film, a third buffer layer is formed to cover the end face exposed by forming an interconnect pattern in the light absorbing layer, the first buffer layer, and the second buffer layer and the top end surface of the second buffer layer, and the third buffer layer is made of a zinc oxide-based thin film.

15 Claims, 7 Drawing Sheets

(56) References Cited

FOREIGN PATENT DOCUMENTS

| | | | |
|---|---|---|---|
| JP | 2002-124688 A | | 4/2002 |
| JP | 2002-319686 A | | 10/2002 |
| JP | 2002-373995 | * | 12/2002 |
| JP | 2002-373995 A | | 12/2002 |
| JP | 2004-103959 A | | 4/2004 |
| JP | 2004-119953 A | | 4/2004 |
| JP | 2004-214300 A | | 7/2004 |
| JP | 2005-191167 A | | 7/2005 |
| JP | 2006-332190 A | | 12/2006 |
| JP | 2006-332440 A | | 12/2006 |
| JP | 2007-287926 A | | 11/2007 |

OTHER PUBLICATIONS

Kushiya, "Yield issues on the fabrication of 30cm×30cm-sized Cu(In,Ga)Se2 based thin film modules", Solar Energy Materials and Solar Cells, Jan. 2003, vol. 75, pp. 171-178.*

International Search Report for PCT Patent App. No. PCT/JP2008/054157 (Apr. 1, 2008).

Office Action from Japanese Patent App. No. 2010-501745 (Aug. 9, 2012).

* cited by examiner

Fig.7

INTEGRATED STRUCTURE OF CIS BASED SOLAR CELL

This application is a national phase entry under 35 U.S.C. §371 of PCT Patent Application No. PCT/JP2008/054157, filed on Mar. 7, 2008, which is incorporated by reference.

TECHNICAL FIELD

The present invention relates to an integrated structure of a CIS based thin film solar cell.

BACKGROUND ART

Currently, CIS based thin film solar cells are widely put into practical use. It is known that, when the CIS based thin film solar cells are manufactured, a thin film solar cell having a high conversion efficiency can be obtained by growing a cadmium sulfide (CdS) layer as a high-resistance buffer layer on an light absorbing layer made of a $CuInSe_2$-based thin film.

Patent Document 1 discloses a chemical bath deposition (CBD) method for chemically depositing a cadmium sulfide (CdS) thin film from a solution by immersing a $CuInSe_2$ thin film light absorbing layer in a solution so that a thin film light absorbing layer and a high-quality heterojunction can be formed, and shunt resistance can increase.

In addition, Patent Document 2 discloses a method of manufacturing a thin film solar cell having a high conversion efficiency, as in the case where the cadmium sulfide (CdS) layer is used as a buffer layer, by using a zinc mixed-crystal compound, i.e., $Zn(O,S,OH)_x$ composed of oxygen, sulfur, and a hydroxyl group chemically grown from a solution on a p-type light absorbing layer as the high-resistance buffer layer.

Furthermore, Patent Document 3 discloses a technique of manufacturing a thin film by successively depositing a buffer layer and a window layer on a glass substrate in that order using a metal organic chemical vapor deposition (MOCVD) method.

Patent Document 1: U.S. Pat. No. 4,611,091
Patent Document 2: Japanese Patent No. 3249342
Patent Document 3: JP-A-2006-332440

DISCLOSURE OF INVENTION

Problems to be Solved by the Invention

In a method disclosed in Patent Document 1 of the related art, when the cadmium sulfide (CdS) layer is grown as the high-resistance buffer layer, an effort is made to minimize a highly toxic cadmium (Cd) a waste solution. However, since solid cadmium sulfide (CdS) and an alkali waste solution are abundantly produced, waste disposal costs increase, and accordingly, the manufacturing costs of the CIS solar cell increase.

Although Patent Document 2 discloses an effective manufacturing method for excluding the cadmium sulfide(CdS) buffer layer that is considered indispensable for manufacturing a thin film solar cell having a high conversion efficiency, the method disclosed in Patent Document 2 is to suppress leakage using the CBD buffer layer, and the method disclosed in Patent Document 3 is to suppress leakage using the buffer layer manufactured using the metal organic chemical vapor deposition (MOCVD) method. Therefore, it is desired to improve both methods.

Particularly, the surface of the light absorbing layer manufactured by performing a sulfidizing reaction at a high temperature for a long time contains a large number of leakage components such as a low-resistance Cu—Se compound and a Cu—S compound in order to obtain a high-quality light absorbing layer. Therefore, it has been demanded to reinforce leakage suppression in order to improve performance of the solar cells.

On the other hand, it is envisaged that leakage can be suppressed by thickening the CBD buffer layer functioning as the main component for suppressing leakage. However, as the CBD buffer layer is thickened, series resistance problematically increases, and as a result, leakage suppression disadvantageously becomes insufficient. Moreover, since the amount of waste produced accordingly increases, the manufacturing costs also increase.

The present invention has been made in order to solve the problems and drawbacks mentioned above, and is aimed at providing a high-efficiency solar cell by which leakage can be suppressed, and a p-n heterojunction interface characteristics can be improved without increasing the series resistance.

Technical Solution

In order to achieve the aforementioned objects, according to an aspect of the present invention, there is provided an integrated structure of a CIS based thin film solar cell obtained by stacking a p-type CIS light absorbing layer, a buffer layer, and an n-type transparent conductive film in that order, wherein the buffer layer has a stack structure of three or more layers, a first buffer layer adjoining the p-type CIS light absorbing layer is made of a compound containing cadmium (Cd), zinc (Zn), or indium (In), a second buffer layer adjoining the first buffer layer is made of a zinc oxide-based thin film, a third buffer layer is formed to cover an end face exposed by forming an interconnect pattern in the p-type CIS light absorbing layer, the first buffer layer, and the second buffer layer and an end face to the n-type transparent conductive film of the second buffer layer, and the third buffer layer is made of a zinc oxide-based thin film.

The third buffer layer may have a resistivity lower than the resistivity of the second buffer layer.

The third buffer layer may have a thickness of 10 to 300 nm.

The third buffer layer may be formed using a metal organic chemical vapor deposition (MOCVD) method.

A concentration of the dopant contained in the third buffer layer may be equal to or lower than $1 \times 10^{19}$ atoms/$cm^3$.

In addition, the dopant may contain any one of aluminum (Al), gallium (Ga), or boron (B).

The third buffer layer may have a resistivity of 0.1 to 100 Ωcm.

The thickness of the first buffer layer may be equal to or smaller than 20 nm, and the thickness of the second buffer layer may be equal to or larger than 100 nm.

A ratio between the thickness of the first buffer layer and the thickness of the second buffer layer (thickness of the second buffer layer/thickness of the first buffer layer) may be equal to or larger than 5.

The first buffer layer may be formed using a chemical bath deposition (CBD) method.

The second buffer layer may be formed using a metal organic chemical vapor deposition (MOCVD) method.

A concentration of the dopant contained in the second buffer layer may be equal to or lower than $1 \times 10^{19}$ atoms/$cm^3$. The dopant may contain any one of aluminum (Al), gallium (Ga), or boron (B).

The first buffer layer may contain any one of $Cd_xS_y$, $Zn_xS_y$, $Zn_xO_y$, $Zn_x(OH)_y$, $In_xS_y$, $In_x(OH)_y$, or $In_xO_y$ (where, x and y denote any natural number).

The concentration of sulfur on the surface of the CIS light absorbing layer may be equal to or higher than 0.5 atoms %.

The second buffer layer may have a resistivity equal to or higher than 0.1 Ωcm.

Effects of the Invention

According to the present invention, it is possible to avoid series resistance from increasing because the second buffer layer having a high resistance exists in a portion corresponding to the interconnect pattern.

It is possible to promote the suppression of leakage by increasing the resistivity of the second buffer layer. For this reason, it is possible to reduce the thickness of the first buffer layer and reduce the series resistance in a p-n junction portion.

Since the resistivity of the third buffer layer is lower than the resistivity of the second buffer layer, the series resistance generates no problems even when the film is manufactured on a portion corresponding to the interconnect pattern. In addition, since the end faces of the first and second buffer layers and the light absorbing layer exposed by forming the interconnect pattern are covered, it is possible to suppress leakage in the end faces. Furthermore, it is possible to obtain a passivation effect in the end faces.

Since the third buffer layer is manufactured using a metal organic chemical vapor deposition (MOCVD) method, it is possible to manufacture, with an excellent coverage, the third buffer layer even on the end face of the interconnect pattern that was difficult to manufacture.

BEST MODE FOR CARRYING OUT THE INVENTION

Hereinafter, an integrated structure of the CIS based thin film solar cell according to an embodiment of the present invention will be described with reference to FIG. 1.

Figure 1:
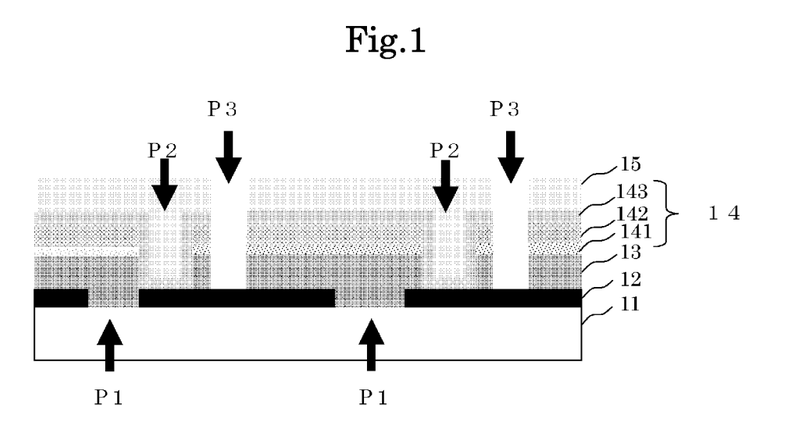
FIG. 1 illustrates an integrated structure of the CIS based solar cell according to an embodiment of the present invention.

Referring to FIG. 1, the CIS based thin film solar cell according to the present embodiment includes a p-n heterojunction device having a substrate structure stacked in the order of a glass substrate 11, a metal back electrode layer 12, a p-type CIS light absorbing layer (hereinafter, simply referred to as an light absorbing layer) 13, a high-resistance buffer layer 14, and an n-type transparent conductive film (hereinafter, simply referred to as a window layer) 15.

The glass substrate 11 is a substrate on which each of the layers are stacked and includes a glass substrate such as blue glass, a metal substrate such as a stainless steel substrate, or a resin substrate such as a polyimide film.

The metal back electrode layer 12 is made of metal having a high anti-corrosion property and a high melting point, such as molybdenum (Mo) or titanium (Ti), having a thickness of 0.2 to 2 μm and manufactured on the glass substrate 11 by a DC sputtering method using such metal as a target.

The light absorbing layer 13 is a thin film having an I-III-$VI_2$ group chalcopyrite structure, a p-type conductivity, and a thickness of 1 to 3 μm. For example, the light absorbing layer 13 includes a multi-source compound semiconductor thin film such as $CuInSe_2$, $Cu(InGa)Se_2$, $Cu(InGa)(SSe)_2$. In addition, the light absorbing layer 13 may include a selenide-based CIS light absorbing layer, a sulfide-based CIS light absorbing layer, and a sulfide/selenide-based CIS light absorbing layer. The selenide-based CIS light absorbing layer may include $CuInSe_2$, $Cu(InGa)Se_2$, or $CuGaSe_2$. The sulfide-based CIS light absorbing layer may include $CuInS_2$, $Cu(InGa)S_2$, or $CuGaS_2$. The sulfide/selenide-based CIS light absorbing layer may include $CuIn(SSe)_2$, $Cu(InGa)(SSe)_2$, or $CuGa(SSe)_2$, and examples of ones having a surface layer include $CuInSe_2$ having $CuIn(SSe)_2$ as a surface layer, $Cu(InGa)Se_2$ having $CuIn(SSe)_2$ as a surface layer, $Cu(InGa)(SSe)_2$ having $CuIn(SSe)_2$ as a surface layer, $CuGaSe_2$ having $CuIn(SSe)_2$ as a surface layer, $Cu(InGa)Se_2$ having $Cu(InGa)(SSe)_2$ as a surface layer, $CuGaSe_2$ having $Cu(InGa)(SSe)_2$ as a surface layer, $Cu(InGa)Se_2$ having $CuGa(SSe)_2$ as a surface layer, and $CuGaSe_2$ having $CuGa(SSe)_2$ as a surface layer.

Two kinds of methods are representatively used to manufacture the light absorbing layer 13: a selenide/sulfide method and a multi-source co-evaporation method.

In the selenide/sulfide method, the light absorbing layer 13 can be manufactured by forming a stack structure including copper (Cu), indium (In), and gallium (Ga) or a mixed-crystal metal precursor film (including Cu/In, Cu/Ga, Cu—Ga alloy/In, Gu—Ga—In alloy, or the like) on the metal back electrode layer 12 using a sputtering method or an evaporation method or the like and then performing heat treatment under a selenium and/or sulfur atmosphere.

In the multi-source co-evaporation method, the light absorbing layer 13 can be manufactured by simultaneously depositing source materials including copper (Cu), indium (In), gallium (Ga), and selenium (Se) in an appropriate combination on the glass substrate 11 having a back electrode layer 12 heated at a temperate equal to or higher than approximately 500° C.

Since an optical band gap can increase in the light incident side by setting a concentration of sulfur on the surface of the light absorbing layer 13 (generally, up to 100 nm from the surface) to be equal to or higher than 0.5 atoms %, and preferably, equal to or higher than 3 atoms %, it is possible to absorb light in a more effective manner. In addition, it is possible to improve a bonding interface characteristic with the CBD buffer layer (described below).

The window layer 15 is a transparent conductive film having an n-type conductivity, a wide band gap, transparency, a low resistance, and a thickness of 0.05 to 2.5 μm. Representatively, the window layer 15 may include a zinc oxide-based thin film or an ITO thin film.

In the case of the zinc oxide-based thin film, the window layer 15 is formed by using, as a dopant, any one selected from a group-III element on the periodic table such as aluminum (Al), gallium (Ga), boron (B), or a combination thereof.

In the present embodiment, the high-resistance buffer layer 14 has a three-layer structure including a CBD buffer layer 141 as a first buffer layer, an MOCVD buffer layer 142 as a second buffer layer, and an MOCVD buffer layer 143 as a third buffer layer. However, the high-resistance buffer layer 14 may have a stack structure having four or more layers.

The CBD buffer layer 141 adjoins a top end face of the light absorbing layer 13 and is formed of a compound composed of cadmium (Cd), zinc (Zn), or indium (In).

The CBD buffer layer 141 has a thickness equal to or smaller than 20 nm, and preferably, equal to or smaller than 10 nm.

The CBD buffer layer 141 is manufactured using a chemical bath deposition (CBD) method. In the chemical bath deposition (CBD) method, a thin film is precipitated on a base material by immersing the base material in a solution containing a chemical species functioning as a precursor and promoting a heterogeneous reaction between the solution and the surface of the base material.

Specifically, an ammonium hydroxide complex salt is formed, for example, by dissolving zinc acetate in ammonium hydroxide at a liquid temperature of 80° C. on the light absorbing layer 13, and a sulfur-containing zinc mixed crystal compound semiconductor thin film is chemically grown from the corresponding solution on the light absorbing layer 13 by dissolving a sulfur-containing salt such as thiourea in that solution and making the resulting solution contact with light absorbing layer 13 for ten minutes. In addition, the grown sulfur-containing zinc mixed crystal compound semiconductor thin film is dried by annealing it at a setting temperature of 200° C. in the atmosphere for fifteen minutes. Furthermore, a high quality sulfur-containing zinc mixed crystal compound can be obtained by converting a part of zinc hydroxide within the film into zinc oxide and at the same time, promoting reformation of sulfur.

The CBD buffer layer 141 may contain $Cd_xS_y$, $Zn_xS_y$, $Zn_xO_y$, $Zn_x(OH)_y$, $In_xS_y$, $In_x(OH)_y$, or $In_xO_y$ (where, x and y denote any natural number) by adjusting the solution.

The MOCVD buffer layer 142 as the second buffer layer is formed of a zinc oxide-based thin film to cover the top end face of the CBD buffer layer 141.

A dopant contained in the MOCVD buffer layer 142 may include any one of aluminum (Al), gallium (Ga), boron (B), or the like. It is possible to obtain a high-resistance film appropriate as the buffer layer by adjusting the dopant concentration to be equal to or lower than $1\times10^{19}$ atoms/cm$^3$, and more preferably, equal to or lower than $1\times10^{18}$ atoms/cm$^3$.

The resistivity of the MOCVD buffer layer 142 is set to be equal to or higher than 0.1 Ωcm, and more preferably, equal to or higher than 1 Ωcm.

In the present embodiment, the MOCVD buffer layer 142 is formed using a metal organic chemical vapor deposition (MOCVD) method.

The MOCVD buffer layer 142 is formed, for example, by filling source materials including a metal organic compound material of zinc (Zn) (such as diethyl zinc or dimethyl zinc) and pure water in a bubbler or the like and bubbling the source materials using inert gas such as helium (He) or argon (Ar) so that a film is formed within a MOCVD apparatus in an accompanied manner.

Alternatively, the MOCVD buffer layer 142 may be formed using a sputtering method as well as the metal organic chemical vapor deposition (MOCVD) method. However, in order to obtain an excellent p-n junction interface with the light absorbing layer, the MOCVD method is more preferable than sputtering, in which high-energy particles act as a film formation species, because damage is seldom generated during film formation in the MOCVD method.

In this case, the MOCVD buffer layer 142 has a thickness equal to or larger than 100 nm.

Therefore, the ratio between the thickness of the CBD buffer layer 141 and the thickness of the MOCVD buffer layer 142 (the thickness of the MOCVD buffer layer 142/the thickness of the CBD buffer layer 141) is set to be equal to or larger than 5 ($\geq 5$).

In the related art, since the CBD buffer layer dominantly suppresses leakage, it is necessary to set the thickness of the CBD buffer layer to be equal to or larger than 50 nm. According to the present invention, since the thickness of the MOCVD buffer layer 142 is set to be thick so that the MOCVD buffer layer 142 dominantly suppresses leakage, it is possible to set the thickness of the CBD buffer layer 141 to be equal to or smaller than 20 nm. As a result, it is possible to remarkably reduce the manufacturing time of the CBD buffer layer 141, realize high tact, reduce the manufacturing costs, and remarkably reduce generation of waste during manufacturing the CBD buffer layer 141. Furthermore, the MOCVD buffer layer 142 has a dominant role in suppressing leakage but, in a typical case, has a complementary role in suppressing leakage. Therefore, it is possible to increase the thickness of the thin MOCVD buffer layer 142, which was equal to or smaller than 50 nm, to be equal to or larger than 100 nm. In addition, it is possible to adjust the concentration or resistivity of the dopant.

The MOCVD buffer layer 143 as the third buffer layer is formed of a zinc oxide-based thin film to cover the end face exposed by forming an interconnect pattern P2 in the light absorbing layer 13, the CBD buffer layer 141, and the MOCVD buffer layer 142 and the top end face of the MOCVD buffer layer 142.

A dopant contained in the MOCVD buffer layer 143 may include any one of aluminum (Al), gallium (Ga), boron (B), or the like, and the concentration thereof is set to be equal to or lower than $1\times10^{19}$ atoms/cm$^3$, and more preferably, equal to or lower than $1\times10^{18}$ atoms/cm$^3$.

The MOCVD buffer layer 143 has a thickness range of 10 to 300 nm, and more preferably, a thickness of 50 to 200 nm.

The resistivity of the MOCVD buffer layer 143 as the third buffer layer is set to be lower than the resistivity of the MOCVD buffer layer 142 as the second buffer layer.

Specifically, the resistivity of the MOCVD buffer layer 142 as the second buffer layer is set to be equal to or higher than 0.1 Ωcm, more preferably equal to or higher than 1 Ωcm, and most preferably equal to or higher than 10 Ωcm. The resistivity of the MOCVD buffer layer 143 as the third buffer layer is set to 0.1 to 100 Ωcm, and more preferably, 0.1 to 10 Ωcm.

As a result, the resistivity of the MOCVD buffer layer 143 as the third buffer layer is lower than the resistivity of the MOCVD buffer layer 142 as the second buffer layer.

From the viewpoint of the stack structure of the CIS based thin film solar cell, the MOCVD buffer layer 142 takes a dominant role in suppressing leakage in the p-n junction portion, and the CBD buffer layer 141 also partially takes a role in suppressing leakage. While the MOCVD buffer layer 143 takes a supplementary role in suppressing leakage, the stack structure is not necessary.

On the other hand, from the viewpoint of the integrated structure as a characteristic of the thin film solar cell, if a high-resistance buffer layer is not provided on a portion corresponding to the pattern 2 for separating the light absorbing layer 13, the n-type window layer 15 directly adjoins the end portion of the light absorbing layer 13 so that leakage occurs. On the contrary, if the high-resistance buffer layer capable of suppressing leakage in the p-n junction portion is provided in the pattern 2, resistance loss is generated in the electric current collected by the pattern 2, and the power output of the solar cell is degraded.

For this reason, according to the present invention, only the MOCVD buffer layer 143 is provided in area corresponding to the pattern 2 as a structure capable of satisfying both demand for the stack structure and demand for the integrated structure at the same time. In other words, the pattern 2 is formed after the CBD buffer layer 141 having a sufficient capability of suppressing leakage and the MOCVD buffer layer 142 are provided as the stack structure, and the exposed end portion of the light absorbing layer 13 is covered by the MOCVD buffer layer 143. In this case, the resistivity and the thickness of the MOCVD buffer layer 13 are adjusted to suppress leakage in the end portion of the light absorbing layer and minimize the resistance loss in the pattern 2.

In addition, while, in the present embodiment, the high-resistance buffer layer 14 is obtained by stacking three layers, the high-resistance buffer layer 14 may be obtained by stacking three or more layers according to the present invention. Even in this case, the same effect can be obtained by manufacturing the buffer layer stacked in uppermost end in the same configuration as that of the aforementioned MOCVD buffer layer 143.

Characteristics of the solar cell according to the aforementioned embodiment are described below.

All of the results shown in FIGS. 2 to 7 are obtained by using an integrated structure having a substrate size of 30 cm×30 cm.

Figure 2:
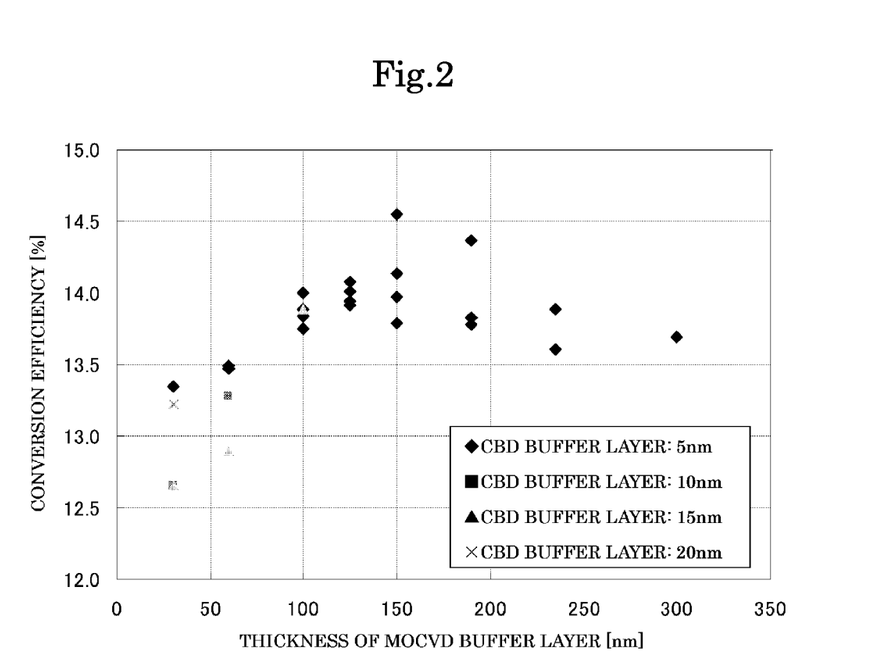
FIG. 2 is a graph illustrating a relationship between the thickness of the MOCVD buffer layer as the second buffer layer and the conversion efficiency.
Figure 3:
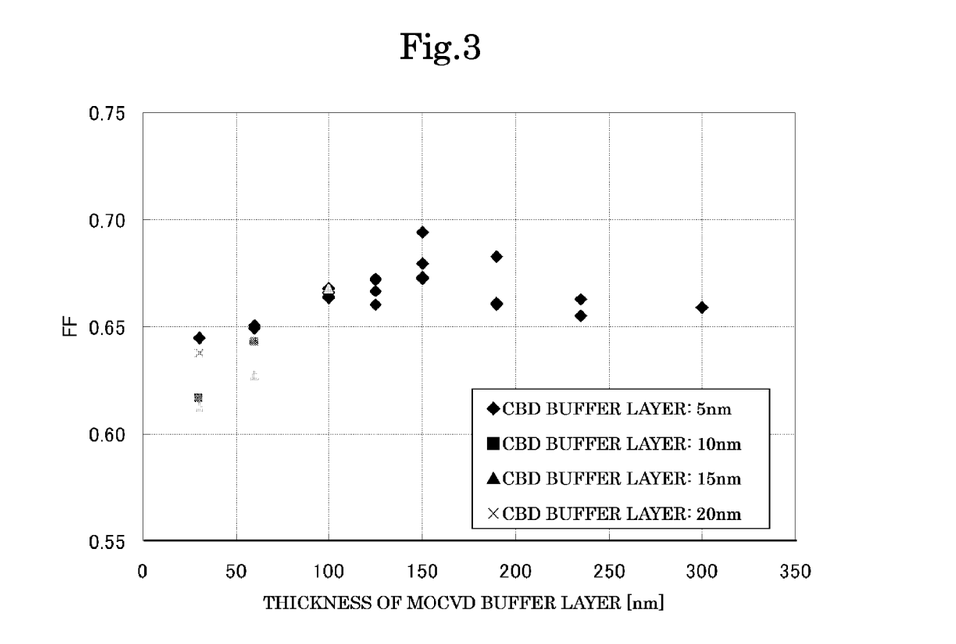
FIG. 3 is a graph illustrating a relationship between the thickness of the MOCVD buffer layer as the second buffer layer and the fill factor (FF).

FIG. 2 is a characteristic graph regarding the thickness (nm) of the MOCVD buffer layer 142 and the conversion efficiency of the solar cell. FIG. 3 illustrates the relationship between the thickness (nm) of the MOCVD buffer layer 142 and a fill factor (FF) of the solar cell.

Figure 4:
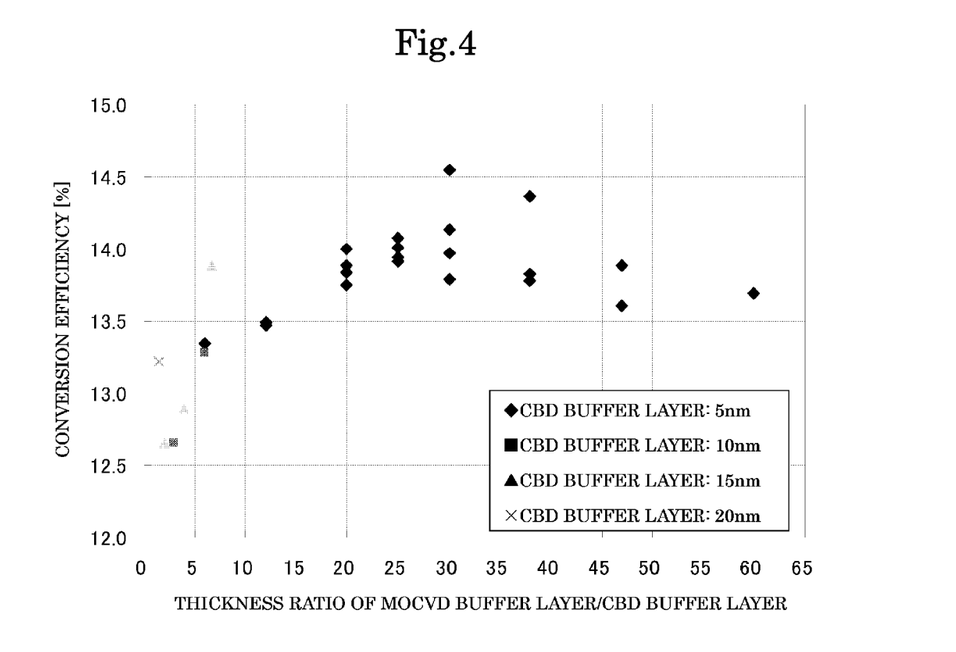
FIG. 4 is a graph illustrating a relationship between the thickness ratio of the MOCVD buffer layer as the second buffer layer/the CBD buffer layer as the first buffer layer and the conversion efficiency.
Figure 5:
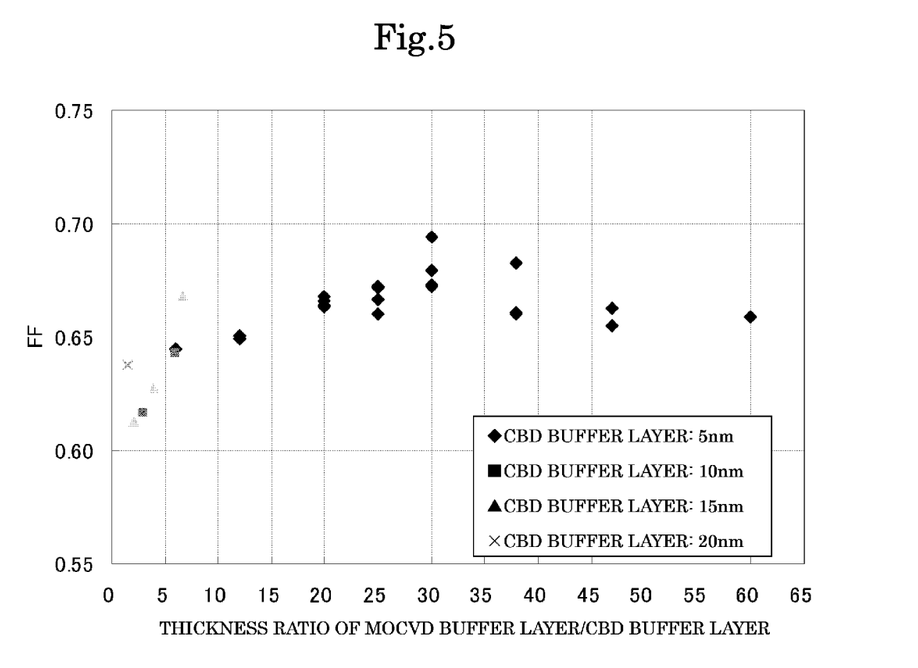
FIG. 5 is a graph illustrating a relationship between the thickness ratio of the MOCVD buffer layer as the second buffer layer/the CBD buffer layer as the first buffer layer and the fill factor (FF).

FIG. 4 illustrates the relationship between the thickness ratio of the MOCVD buffer layer 142/the CBD buffer layer 141 and the conversion efficiency (%). FIG. 5 illustrates the relationship between the thickness ratio between the MOCVD buffer layer 142/the CBD buffer layer 141 and the fill factor (FF).

Figure 6:
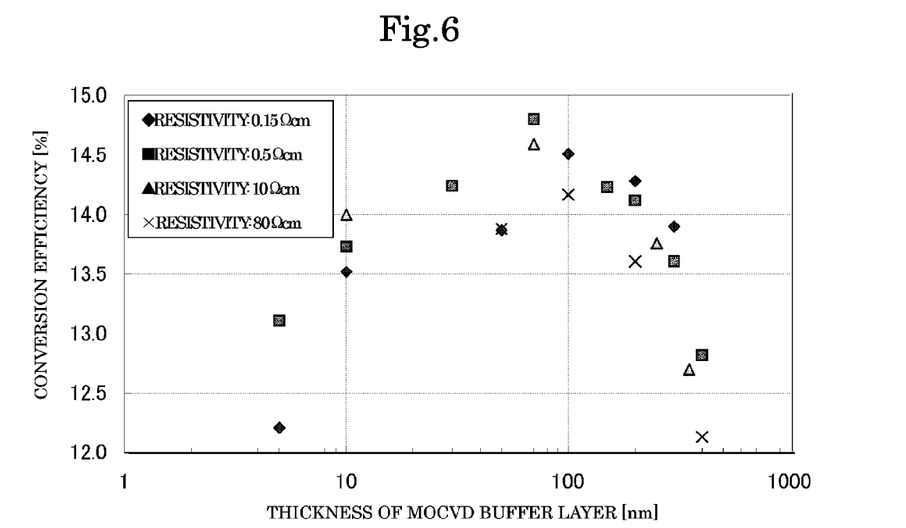
FIG. 6 is a graph illustrating a relationship between the thickness of the MOCVD buffer layer as the third buffer layer and the conversion efficiency.
Figure 7:
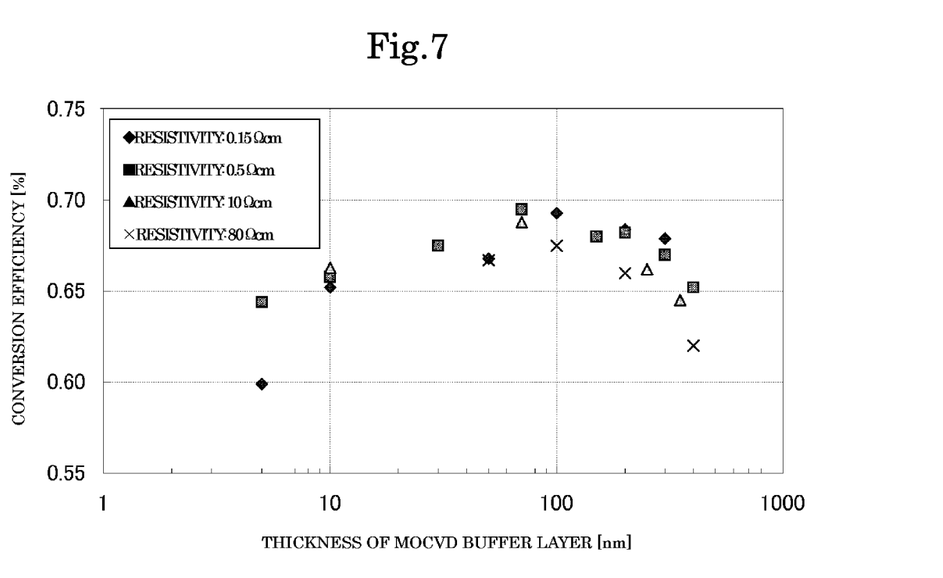
FIG. 7 is a graph illustrating a relationship between the thickness of the MOCVD buffer layer as the third buffer layer and the fill factor (FF).

FIG. 6 is a characteristic graph regarding the thickness of the MOCVD buffer layer 143 and the conversion efficiency of the solar cell. FIG. 7 illustrates the relationship between the thickness (nm) of the MOCVD buffer layer 143 and a fill factor (FF) of the solar cell.

In the graph of FIG. 2, the abscissa denotes the thickness of the MOCVD buffer layer 142, and the ordinate denotes the conversion efficiency (%). In the graph of FIG. 3, the abscissa denotes the thickness of the MOCVD buffer layer 142, and the ordinate denotes the fill factor (FF).

In the graph of FIG. 4, the abscissa denotes the thickness ratio of the MOCVD buffer layer 142/the CBD buffer layer 141, and the ordinate denotes the conversion efficiency (%). In the graph of FIG. 5, the abscissa denotes the thickness ratio of the MOCVD buffer layer 142/the CBD buffer layer 141, and the ordinate denotes the conversion efficiency (%).

In each of the graphs, the conversion efficiency depending on the thickness of the CBD buffer layer 141 and variation of the fill factor (FF) are presented. In addition, in FIGS. 2 to 5, the MOCVD buffer layer 143 has a thickness of 70 nm and resistivity of 0.5 Ωcm.

In the graph of FIG. 6, the abscissa denotes the thickness of the MOCVD buffer layer 143, and the ordinate denotes the conversion efficiency (%). In the graph of FIG. 7, the abscissa denotes the thickness of the MOCVD buffer layer 143, and the ordinate denotes the fill factor (FF).

In each of the graphs, the conversion efficiency depending on the resistivity of the MOCVD buffer layer 143 and variation of the fill factor (FF) is presented.

As shown in FIGS. 2 and 3, it is possible to achieve a conversion efficiency equal to or higher than 13.5% in any case using the CBD buffer layer having a thickness of 5 nm, 10 nm, 15 nm, or 20 nm by increasing the thickness of the MOCVD buffer layer 142 to be equal to or larger than 60 nm, and more preferably, equal to or larger than 100 nm.

In addition, in the relationship of the thickness ratio of (MOCVD buffer layer 142)/(CBD buffer layer 141), it is possible to achieve the conversion efficiency equal to or higher than 13.5% in any case using the CBD buffer layer having a thickness of 5 nm, 10 nm, 15 nm, or 20 nm by setting the thickness ratio to be equal to or larger than 5, preferably equal to or larger than 10, and more preferably, equal to or larger than 20.

It is possible to achieve a fill factor (FF) equal to or larger than 0.65 and a further larger value using the CIS based thin film solar cell having a large-sized integrated structure. This effect can be achieved by reduction of the series resistance and suppression of leakage using the buffer layer structure according to the present invention. While, in the present embodiment, the thickness of the MOCVD buffer layer 143 is set to 70 nm, and the resistivity is set to 0.5 Ωcm, the same effects can be achieved by setting the thickness of the MOCVD buffer layer 143 to 10 to 300 nm and the resistivity to 0.1 to 100 Ωcm.

Next, as shown in FIGS. 6 and 7, it is possible to achieve the conversion efficiency equal to or higher than 13.5% in any case using the MOCVD buffer layer 143 having the resistivity of 0.15 Ωcm, 0.5 Ωcm, 10 Ωcm, or 80 Ωcm by setting the thickness of the MOCVD buffer layer 143 to 10 to 300 nm, and more preferably, 50 to 200 nm. Meanwhile, it was observed that, when the resistivity of the MOCVD buffer layer 143 is lower than 0.1 Ωcm, the leakage suppression effect in the end face of the light absorbing layer 13 is not sufficient so that the fill factor (FF) may be slightly degraded. In addition, it was observed that, when the resistivity of the MOCVD buffer layer 143 is higher than 100 Ωcm, the series resistance increases so that the fill factor (FF) is degraded.

A method of manufacturing the integrated structure according to the aforementioned embodiments is described below. First, the electrode pattern P1 of the metal back electrode layer 12 is formed on the glass substrate 11, and the light absorbing layer 13, the CBD buffer layer 141, and the MOCVD buffer layer 142 are manufactured thereon.

The pattern 2 is formed by cutting the light absorbing layer 13, the CBD buffer layer 141, and the MOCVD buffer layer 142 using a mechanical scribe apparatus or a laser scribe apparatus at the time point that the MOCVD buffer layer 142 is manufactured. Then, the MOCVD buffer layer 143 as the third buffer layer is manufactured thereon using a metal organic chemical vapor deposition (MOCVD) method.

Alternatively, the MOCVD buffer layers 142 and 143 may be formed using a sputtering method as well as the metal organic chemical vapor deposition (MOCVD) method. However, in order to obtain an excellent p-n junction interface with the light absorbing layer, the MOCVD method is more preferable than sputtering, in which high-energy particles act as a film formation species, because damage is seldom generated during film formation in the MOCVD method.

In this manner, according to the aforementioned embodiments, it is possible to avoid the series resistance from increasing because the MOCVD buffer layer 142 as the second buffer layer having a high resistance exists in a portion corresponding to the interconnect pattern P2. In addition, it is possible to promote suppression of leakage by increasing the resistivity of the MOCVD buffer layer 142.

In addition, the series resistance generates no problems even when a film is manufactured on a portion corresponding to the interconnected pattern P2 by setting the resistivity of the MOCVD buffer layer 143 as the third buffer layer to be lower than the resistivity of the MOCVD buffer layer 142 as the second buffer layer. Furthermore, it is possible to suppress leakage in the end face by covering the side end face of the MOCVD buffer layer 142, the CBD buffer layer 141, and the light absorbing layer 13 exposed by forming the interconnect pattern P2. Moreover, a passivation effect can be obtained in the end face.

Although it is difficult to manufacture the MOCVD buffer layer 143 in the end face of the interconnect pattern, it is possible to manufacture a film with excellent coverage using the metal organic chemical vapor deposition (MOCVD) method.

EXPLANATION OF REFERENCE

11 GLASS SUBSTRATE
12 METAL BACK ELECTRODE LAYER
13 light absorbing LAYER
14 HIGH-RESISTANCE BUFFER LAYER
15 WINDOW LAYER
141 CBD BUFFER LAYER (FIRST BUFFER LAYER)
142 MOCVD BUFFER LAYER (SECOND BUFFER LAYER)
143 MOCVD BUFFER LAYER (THIRD BUFFER LAYER)
P1 PATTERN 1
P2 PATTERN 2
P3 PATTERN 3

The invention claimed is:

1. An integrated structure of a CIS based thin film solar cell obtained by stacking a p-type CIS light absorbing layer, a buffer layer, and an n-type transparent conductive film in that order,
wherein the buffer layer has a stack structure of three or more layers,
a first buffer layer adjoining the p-type light absorbing layer is made of a compound containing cadmium (Cd), zinc (Zn), or indium (In),
a second buffer layer adjoining the first buffer layer is made of a zinc oxide-based thin film,
a third buffer layer is formed to cover
end faces exposed by forming an interconnect pattern in the p-type CIS light absorbing layer, the first buffer layer, and the second buffer layer, and
an end face to the n-type transparent conductive film and the second buffer layer, and
the third buffer layer is made of a zinc oxide-based thin film having a high resistivity of 0.1 to 100 Ωcm.

2. The integrated structure of the CIS based thin film solar cell according to claim 1, wherein the third buffer layer has a resistivity lower than the resistivity of the second buffer layer.

3. The integrated structure of the CIS based thin film solar cell according to claim 1, wherein the third buffer layer has a thickness of 10 to 300 nm.

4. The integrated structure of the CIS based thin film solar cell according to claim 1, wherein the third buffer layer is formed using a metal organic chemical vapor deposition (MOCVD) method.

5. The integrated structure of the CIS based thin film solar cell according to claim 1, wherein a concentration of a dopant contained in the third buffer layer is equal to or lower than $1 \times 10^{19}$ atoms/cm$^3$.

6. The integrated structure of the CIS based thin film solar cell according to claim 5, wherein the dopant contains any one of aluminum (Al), gallium (Ga), or boron (B).

7. The integrated structure of the CIS based thin film solar cell according to claim 1, wherein a thickness of the first buffer layer is equal to or smaller than 20 nm, and a thickness of the second buffer layer is equal to or larger than 100 nm.

8. The integrated structure of the CIS based thin film solar cell according to claim 1, wherein a ratio between a thickness of the second buffer layer to a thickness of the first buffer layer is equal to or larger than 5.

9. The integrated structure of the CIS based thin film solar cell according to claim 1, wherein the first buffer layer is formed using a chemical bath deposition (CBD) method.

10. The integrated structure of the CIS based thin film solar cell according to claim 1, wherein the second buffer layer is formed using a metal organic chemical vapor deposition (MOCVD) method.

11. The integrated structure of the CIS based thin film solar cell according to claim 1, wherein a concentration of a dopant contained in the second buffer layer is equal to or lower than $1 \times 10^{19}$ atoms/cm$^3$.

12. The integrated structure of the CIS based thin film solar cell according to claim 11, wherein the dopant contains any one of aluminum (Al), gallium (Ga), or boron (B).

13. The integrated structure of the CIS based thin film solar cell according to claim 1, wherein the first buffer layer contains any one of $Cd_xS_y$, $Zn_xS_y$, $Zn_xO_y$, $Zn_x(OH)_y$, $In_xS_y$, $In_x(OH)_y$, or $In_xO_y$ (where, x and y denote any natural number).

14. The integrated structure of the CIS based thin film solar cell according to claim 1, wherein a concentration of sulfur on a surface of the CIS light absorbing layer is equal to or higher than 0.5 atoms %.

15. The integrated structure of the CIS based thin film solar cell according to claim 1, wherein the second buffer layer has resistivity equal to or higher than 0.1 Ωcm.

* * * * *